(12) United States Patent
Yang et al.

(10) Patent No.: US 9,129,815 B2
(45) Date of Patent: Sep. 8, 2015

(54) SEMICONDUCTOR DEVICE

(71) Applicant: Samsung Electronics Co., Ltd., Suwon-si (KR)

(72) Inventors: Jung-Gil Yang, Suwon-si (KR); Sang-Su Kim, Yongin-si (KR); Chang-Jae Yang, Seoul (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 14/155,192

(22) Filed: Jan. 14, 2014

(65) Prior Publication Data

US 2014/0367741 A1    Dec. 18, 2014

(30) Foreign Application Priority Data

Jun. 17, 2013    (KR) ........................ 10-2013-0069041

(51) Int. Cl.
*H01L 21/02* (2006.01)
*H01L 29/04* (2006.01)
*H01L 29/78* (2006.01)

(52) U.S. Cl.
CPC ................ *H01L 29/04* (2013.01); *H01L 29/78* (2013.01)

(58) Field of Classification Search
CPC .................................. H01L 29/04; H01L 29/78
See application file for complete search history.

(56) References Cited

U.S. PATENT DOCUMENTS

| 6,600,170 | B1 | 7/2003 | Xiang | |
|---|---|---|---|---|
| 7,138,649 | B2 | 11/2006 | Currie et al. | |
| 7,229,892 | B2 * | 6/2007 | Usuda et al. | 438/405 |
| 7,384,829 | B2 | 6/2008 | Cheng et al. | |
| 7,538,390 | B2 | 5/2009 | Wang et al. | |
| 7,662,689 | B2 | 2/2010 | Boyanov et al. | |
| 7,888,197 | B2 | 2/2011 | Chidambarrao et al. | |
| 7,993,998 | B2 | 8/2011 | Chen et al. | |
| 8,039,335 | B2 | 10/2011 | Beyer et al. | |
| 8,159,030 | B2 | 4/2012 | Waite et al. | |
| 8,390,026 | B2 * | 3/2013 | Winstead et al. | 257/190 |
| 2006/0011983 | A1 | 1/2006 | Fitzgerald | |
| 2008/0012018 | A1 * | 1/2008 | Waite et al. | 257/69 |
| 2008/0268587 | A1 * | 10/2008 | Sadaka et al. | 438/199 |
| 2009/0224321 | A1 * | 9/2009 | Tsuchiya | 257/351 |
| 2012/0080722 | A1 | 4/2012 | Yin et al. | |
| 2014/0091310 | A1 * | 4/2014 | Jeon et al. | 257/76 |
| 2014/0246696 | A1 * | 9/2014 | Flachowsky et al. | 257/190 |
| 2014/0374797 | A1 * | 12/2014 | Kwon et al. | 257/190 |

FOREIGN PATENT DOCUMENTS

KR    10-20060032092 A    4/2006

* cited by examiner

*Primary Examiner* — Victor A Mandala
(74) *Attorney, Agent, or Firm* — Muir Patent Law, PLLC

(57) ABSTRACT

Provided is a semiconductor device comprising a substrate including a first area and a second area, first through third crystalline layers sequentially stacked on the first area and having first through third lattice constants, respectively, a first gate electrode formed on the third crystalline layer, fourth and fifth crystalline layers sequentially stacked on the second area and having fourth and fifth lattice constants, respectively, and a second gate electrode formed on the fifth crystalline layer, wherein the third lattice constant is greater than the second lattice constant, the second lattice constant is greater than the first lattice constant, and the fifth lattice constant is smaller than the fourth lattice constant.

20 Claims, 14 Drawing Sheets

SEMICONDUCTOR DEVICE

This application claims priority to Korean Patent Application No. 10-2013-0069041 filed on Jun. 17, 2013 in the Korean Intellectual Property Office, the disclosure of which is incorporated herein by reference in its entirety.

BACKGROUND

1. Field of the Invention

The present disclosure relates to a semiconductor device, and more particularly, to a semiconductor device which may improve the mobility of carriers.

2. Description of the Related Art

A complementary metal-oxide semiconductor (CMOS) is a semiconductor device configured such that a P-type transistor and an N-type transistor operate complementarily. The mobility of carriers of the P-type transistor is smaller than that of carriers of the N-type transistor. Therefore, research is being conducted to improve the performance of the P-type transistor. For example, methods of applying compressive stress to a channel of the P-type transistor and applying tensile stress to a channel of the N-type transistor are being researched.

SUMMARY

Aspects of the present disclosure provide a semiconductor device which may improve the mobility of carriers.

Aspects of the present disclosure also provide a method of fabricating a semiconductor device which may improve the mobility of carriers.

However, aspects of the present disclosure are not restricted to the one set forth herein. The above and other aspects of the present disclosure will become more apparent to one of ordinary skill in the art to which the present disclosure pertains by referencing the detailed description of the present disclosure given below.

According to an aspect of the present disclosure, there is provided a semiconductor device comprising a substrate including a first area and a second area, first through third crystalline layers which are sequentially stacked on the first area and having first through third lattice constants, respectively, a first gate electrode formed on the third crystalline layer, fourth and fifth crystalline layers sequentially stacked on the second area and having fourth and fifth lattice constants, respectively, and a second gate electrode formed on the fifth crystalline layer, wherein the third lattice constant is greater than the second lattice constant, the second lattice constant is greater than the first lattice constant, and the fifth lattice constant is smaller than the fourth lattice constant.

According to another aspect of the present disclosure, there is provided a semiconductor device comprising a substrate in which a P-type transistor area and an N-type transistor area are defined, a first compound semiconductor layer formed on the P-type transistor area and having a first composition ratio and a second compound semiconductor layer on the first compound semiconductor layer and having a second composition ratio different from the first composition ratio, a first gate electrode formed on the second compound semiconductor layer, a third compound semiconductor layer on the N-type transistor area and having the first composition ratio, and a second gate electrode formed on the third compound semiconductor layer, wherein the third compound semiconductor layer is thicker than the first compound semiconductor layer.

According to still another aspect of the present disclosure, there is provided a semiconductor device comprising a substrate including a first area and a second area, first and second crystalline layers sequentially stacked on the first area and having first and second lattice constants, respectively, a first gate electrode formed on the second crystalline layer, third and fourth crystalline layers sequentially stacked on the second area and having third and fourth lattice constants, respectively, and a second gate electrode formed on the fourth crystalline layer, wherein the second lattice constant is greater than the first lattice constant, the first lattice constant is greater than the third lattice constant, and the fourth lattice constant is smaller than the third lattice constant.

BRIEF DESCRIPTION OF THE DRAWINGS

The present disclosure will become more apparent by describing in detail exemplary embodiments thereof with reference to the attached drawings in which.

DETAILED DESCRIPTION OF THE EMBODIMENTS

Figure 1:
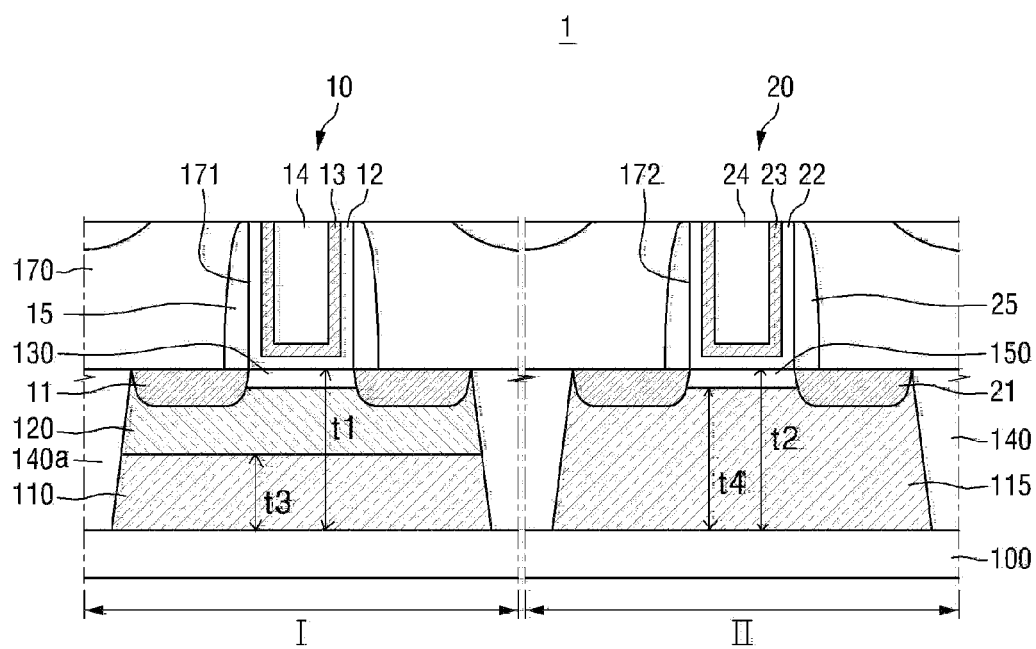
FIG. 1 is a cross-sectional view of a semiconductor device according to a first embodiment.

The present disclosure will now be described more fully hereinafter with reference to the accompanying drawings, in which preferred embodiments of the disclosure are shown. This invention may, however, be embodied in different forms and should not be construed as limited to the embodiments set forth herein. The same reference numbers indicate the same components throughout the specification. In the attached figures, the thickness of layers and regions is exaggerated for clarity.

It will also be understood that when a layer is referred to as being "on" another layer or substrate, it can be directly on the other layer or substrate, or intervening layers may also be present. In contrast, when an element is referred to as being "directly on" another element, there are no intervening elements present.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The use of the terms "a" and "an" and "the" and similar referents in the context of describing the disclosure (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Unless the context indicates otherwise, terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes.

It will be understood that, although the terms first, second, etc. may be used herein to describe various elements, these elements should not be limited by these terms unless the context indicates otherwise. Unless indicated otherwise, these terms are only used to distinguish one element from another. For example, a first signal could be termed a second signal, and, similarly, a second signal could be termed a first signal without departing from the teachings of the disclosure.

Unless defined otherwise, all technical and scientific terms used herein have the same meaning as commonly understood by one of ordinary skill in the art to which this disclosure belongs. It is noted that the use of any and all examples, or exemplary terms provided herein is intended merely to better illuminate the invention and is not a limitation on the scope of the invention unless otherwise specified. Further, unless defined otherwise, all terms defined in generally used dictionaries may not be overly interpreted.

The present disclosure will be described with reference to perspective views, cross-sectional views, and/or plan views, in which preferred embodiments of the disclosure are shown. Thus, the profile of an exemplary view may be modified according to manufacturing techniques and/or allowances. The embodiments of the disclosure are not intended to limit the scope of the present invention but cover all changes and modifications that can be caused due to a change in manufacturing process. Thus, regions shown in the drawings are illustrated in schematic form and the shapes of the regions are presented simply by way of illustration and not as a limitation.

FIG. 1 is a cross-sectional view of a semiconductor device 1 according to a first embodiment.

Referring to FIG. 1, the semiconductor device 1 according to the first embodiment includes a substrate 100 and first and second transistors 10 and 20. In an example, the first transistor 10 may be, but is not limited to, a P-type transistor, and the second transistor 20 may be, but is not limited to, an N-type transistor.

A first area I and a second area II are defined in the substrate 100.

As shown in the drawing, first through third crystalline layers 110 through 130 may be stacked sequentially on the first area I. A fourth crystalline layer 115 and a fifth crystalline layer 150 may be stacked sequentially on the second area II.

The first through third crystalline layers 110 through 130 have first through third lattice constants, respectively. The third lattice constant may be greater than the second lattice constant, and the second lattice constant may be greater than the first lattice constant.

The fourth crystalline layer 115 and the fifth crystalline layer 150 may have a fourth lattice constant and a fifth lattice constant, respectively. The fifth lattice constant may be smaller than the fourth lattice constant.

In the semiconductor device 1 according to the first embodiment, the first crystalline layer 110 and the fourth crystalline layer 115 may be identical materials. This is because part of the fourth crystalline layer 115 and the first crystalline layer 110 are formed simultaneously (see FIG. 12), as will be described later. Alternatively, the first lattice constant of the first crystalline layer 110 may be equal to the fourth lattice constant of the fourth crystalline layer 115.

As described above, the third lattice constant is greater than the second lattice constant, the second lattice constant is greater than the first lattice constant, and the second crystalline layer 120 is sufficiently thicker than the third crystalline layer 130. Therefore, the third crystalline layer 130 may receive compressive stress. Also, the third crystalline layer 130 may be a first channel layer of the first transistor 10. Therefore, the third crystalline layer 130 may be a compressive strained channel.

Here, the third crystalline layer 130 may receive biaxial stress. Since the second crystalline layer 120 and the third crystalline layer 130 contact each other planarly (two-dimensionally), stress is planarly applied to the third crystalline layer 130. Therefore, the mobility of carriers (e.g., holes) can be increased as compared with a case where stress is applied to the third crystalline layer 130 only in one direction (for example, a case where a source/drain region is filled with a stress material).

Similarly, since the fifth lattice constant is smaller than the fourth lattice constant and the fourth crystalline layer 115 is sufficiently thicker than the fifth crystalline layer 150, the fifth crystalline layer 150 may receive tensile stress. Also, the fifth crystalline layer 150 may be a second channel layer of the second transistor 20. Therefore, the fifth crystalline layer 150 may be a tensile strained channel.

In addition, the fifth crystalline layer 150 may receive biaxial stress. Since the fifth crystalline layer 150 and the fourth crystalline layer 115 contact each other planarly (i.e., two-dimensionally), stress is planarly applied to the fifth crystalline layer 150. Therefore, the mobility of carriers (e.g., electrons) can be increased.

For example, the first crystalline layer 110 and the second crystalline layer 120 may serve as a stress relaxed buffer (SRB) that reduces a lattice mismatch between the substrate 100 and the third crystalline layer 130 (i.e., a channel layer). Likewise, the fourth crystalline layer 115 may serve as an SRB that reduces a lattice mismatch between the substrate 100 and the fifth crystalline layer 150.

The above-described lattice constants may be realized as follows. In an example, the first crystalline layer 110 may include a first material and a second material in a first composition ratio, and the second crystalline layer 120 may include the first material and the second material in a second composition ratio different from the first composition ratio. In addition, the third crystalline layer 130 may include the first material and the second material in a third composition rate different from the first and second composition ratios. In one embodiment, the first through third crystalline layers 110 through 130 may be formed of the same materials in different composition ratios.

More specifically, the first crystalline layer 110 may include $Si_{1-x}Ge_x$ (0<x<1), and the second crystalline layer 120 may include $Si_{1-y}Ge_y$ (0<y<1, y>x). In addition, the third crystalline layer 130 may include $Si_{1-z}Ge_z$ (0<z≤1, z>y). For example, since z>y>x, the third lattice constant may be greater than the second lattice constant, and the second lattice constant may be greater than the first lattice constant.

In an example, the first crystalline layer 110 may be $Si_{0.7}Ge_{0.3}$, the second crystalline layer 120 may be $Si_{0.3}Ge_{0.7}$, and the third crystalline layer 130 may be $Si_{0.1}Ge_{0.9}$ or Ge. The third crystalline layer 130 may be a compound semiconductor (e.g., $Si_{0.1}Ge_{0.9}$) or an element semiconductor (e.g., Ge).

In addition, as described above, the fifth lattice constant is smaller than the fourth lattice constant, and the first lattice constant is equal to the fourth lattice constant. Therefore, the fourth crystalline layer 115 may include $Si_{1-x}Ge_x$ (0<x<1) which is the same material as the first crystalline layer 110. The fifth crystalline layer 150 may be, but is not limited to, an element semiconductor (e.g., Si).

The first through fourth crystalline layers 110 through 115 are not limited to SiGe which is a group IV compound semiconductor and may also be group III-V compound semiconductors (e.g., GaAs, InP, InAlAs, InAs, InSb, etc.). In addition, the fifth crystalline layer 150 is not limited to Si. The fifth crystalline layer 150 may also be another group IV element semiconductor or a group IV compound semiconductor.

The first crystalline layer 110 and the fourth crystalline layer 115 may be identical materials. However, the fourth crystalline layer 115 may be thicker than the first crystalline layer 110 (i.e., t3<t4). This is because the fourth crystalline layer 115 is formed by epitaxially growing the first crystalline layer formed on the second area II (see FIGS. 14 and 15).

Also, as a result of the epitaxial growth, a total thickness t1 of the first through third crystalline layers 110 through 130 may be, but is not limited to, equal to a total thickness t2 of the fourth crystalline layer 115 and the fifth crystalline layer 150.

A first device isolation layer 140a may be formed around the first through third crystalline layers 110 through 130. A height of a top surface of the third crystalline layer 130 and a height of a top surface of the first device isolation layer 140a may be equal to each other. However, the present invention is not limited thereto. Likewise, a second device isolation layer 140 may be formed around the fourth crystalline layer 115 and the fifth crystalline layer 150. A height of a top surface of the fifth crystalline layer 150 and a height of a top surface of the second device isolation layer 140 may be equal to each other. However, the present invention is not limited thereto.

As shown in the drawing, a bottom surface of the first crystalline layer 110 and a bottom surface of the first device isolation layer 140a may be connected to each other. A bottom surface of the fourth crystalline layer 115 and a bottom surface of the second device isolation layer 140 may be connected to each other.

In addition, the first crystalline layer 110 and the fourth crystalline layer 115 are formed on the substrate 100 to directly contact the substrate 100. Since the first crystalline layer 110, the second crystalline layer 120, and the third crystalline layer 130 are sequentially formed on the substrate 100 by an epitaxial method (see e.g., FIG. 12) as will be described later, the substrate 100 directly contacts the first crystalline layer 110 and the fourth crystalline layer 115.

The first transistor 10 is formed on the first area I on which the first through third crystalline layers 110 through 130 are formed as described above. Since the third crystalline layer 130 is the compressive strained channel, the mobility of holes of the first transistor 10, which is a P-type transistor, may be increased.

The second transistor 20 is formed on the second area II on which the fourth crystalline layer 115 and the fifth crystalline layer 150 are formed. Since the fifth crystalline layer 150 is the tensile strained channel, the mobility of electrons of the second transistor 20, which is an N-type transistor, can be increased.

An interlayer insulating film 170 may be formed on the substrate 100. The interlayer insulating film 170 may include first and second trenches 171 and 172. The first trench 171 may be formed on the first region I of the substrate 100, and the second trench 172 may be formed on the second area II of the substrate 100. First and second spacers 15 and 25 may be formed on sidewalls of the first and second trenches 171 and 172, respectively. In an example, the first and second spacers 15 and 25 may include, but not limited to, a nitride layer or an oxynitride layer. Unlike the illustration in FIG. 1, the first and second spacers 15 and 25 may be L-shaped.

The first transistor 10 includes a first gate electrode (13, 14), a first gate insulating layer 12, and first source/drain regions 11. The second transistor 20 includes a second gate electrode (23, 24), a second gate insulating layer 22, and second source/drain regions 21.

The first gate electrode (13, 14) may be formed within the first trench 171, and the second gate electrode (23, 24) may be formed within the second trench 172. The first gate electrode (13, 14) may include the first gate insulating layer 12, a first bottom gate metal 13, and a first top gate metal 14. The second gate electrode (23, 24) may include the second gate insulating layer 22, a second bottom gate metal 23, and a second top gate metal 24.

The first gate insulating layer 12 may be conformally formed along sidewalls and a bottom surface of the first trench 171, and the second gate insulating layer 22 may be conformally formed along sidewalls and a bottom surface of the second trench 172. The first and second gate insulating layers 12 and 22 may be formed of a silicon oxide layer. Alternatively, the first and second gate insulating layers 12 and 22 may be formed of a high-k material layer having a higher dielectric constant than that of the silicon oxide layer. In an example, the first and second gate insulating layers 12 and 22 may include at least one material selected from the group consisting of HfSiON, $HfO_2$, $ZrO_2$, $Ta_2O_5$, $TiO_2$, $SrTiO_5$ and $(Ba, Sr)TiO_3$. The first and second gate insulating layers 12 and 22 may be formed to various thicknesses according to embodiments.

The first and second bottom gate metals 13 and 23 may be formed on the first and second gate insulating layers 12 and 22, respectively. The first bottom gate metal 13 may be conformally formed on the first gate insulating layer 12 within the first trench 171. The second bottom gate metal 23 may be conformally formed on the second gate insulating layer 22 within the second trench 172. In an example, the first and second bottom gate metals 13 and 23 may include, but not limited to, TiN. The first and second top gate metals 14 and 24 may be formed on the first and second bottom gate metals 13 and 23 to fill the first and second trenches 171 and 172, respectively. In an example, the first and second top gate metals 14 and 24 may include, but not limited to, W.

The first and second source/drain regions 11 and 21 may be formed on both sides of the first and second gate electrodes (13, 14, 23, 24), respectively. As shown in FIG. 1, the first source/drain regions 11 may be formed by recessing the second crystalline layer 120 and the third crystalline layer 130 as will be described later, and the second source/drain regions 21 may be formed by recessing the fourth crystalline layer 115 and the fifth crystalline layer 150 as will be described later. Alternatively, the first and second source/drain regions 11 and 21 may be formed by recessing the first and second channel layers (i.e., the third and fifth crystalline layers 130 and 150).

In addition, the first and second source/drain regions 11 and 21 may be elevated source/drain regions. The first source/drain regions 11 may include a compressive stress material. In an example, the compressive stress material may be, but is not limited to, SiGe having a greater lattice constant than Si. The compressive stress material may adjust the mobility of carriers of the first transistor 10 by applying compressive stress to a channel region of the first transistor 10. The second source/drain regions 21 may include the same material as the substrate 100 or a tensile stress material. In an example, the tensile stress material may be, but is not limited to, SiC having a smaller lattice constant than Si. The tensile stress material may adjust the mobility of carriers of the second transistor 20 by applying tensile stress to a channel region of the second transistor 20.

In an example, the substrate 100 may be a substrate formed of Si. Alternatively, the substrate 100 may be, but is not limited to, a substrate formed of at least one semiconductor material selected from the group consisting of Si, Ge, SiGe, GaP, GaAs, SiC, SiGeC, InAs and InP, a silicon-on-insulator (SOI) substrate, a quartz substrate, a rigid substrate such as a glass substrate for displays, or a flexible plastic substrate formed of polyimide, polyethylene terephthalate (PET), polyethylene naphthalate (PEN), poly methyl methacrylate (PMMA), polycarbonate (PC), polyethersulfone (PES) or polyester.

Figure 2:
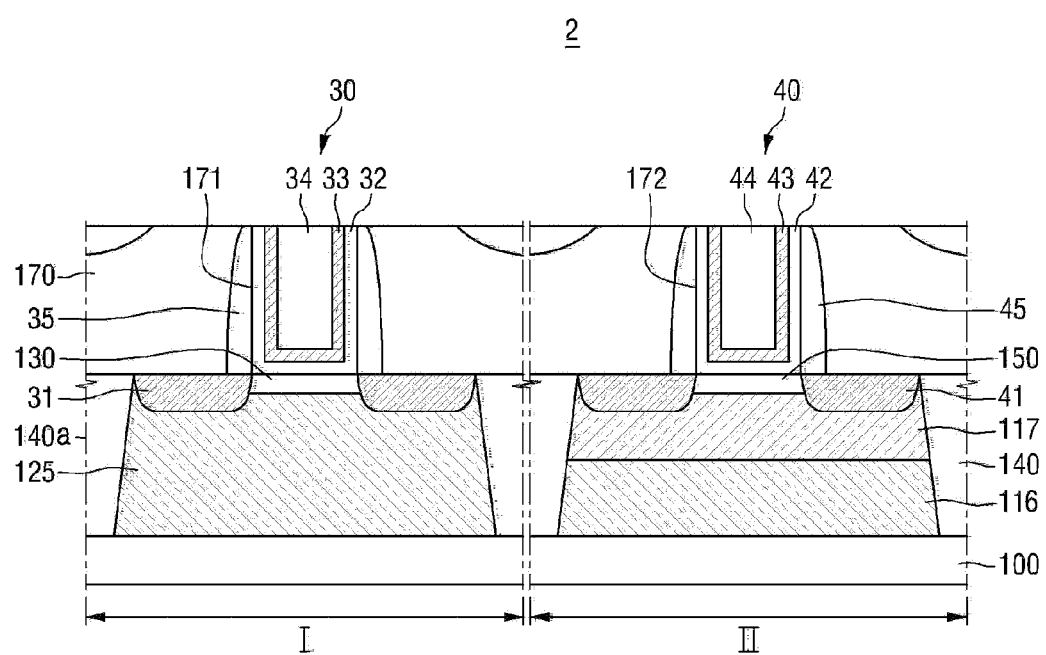
FIG. 2 is a cross-sectional view of a semiconductor device according to a second embodiment.

FIG. 2 is a cross-sectional view of a semiconductor device 2 according to a second embodiment. For simplicity, the following description will focus on differences from FIG. 1.

Referring to FIG. 2, the semiconductor device 2 according to the second embodiment includes a substrate 100 and first and second transistors 30 and 40 formed on the substrate 100. In an example, the first transistor 30 may be a P-type transistor, and the second transistor 40 may be an N-type transistor.

A first area I may include a sixth crystalline layer 125 and a third crystalline layer 130 formed on the sixth crystalline layer 125. A second area II may include a seventh crystalline layer 116, an eighth crystalline layer 117, and a fifth crystalline layer 150 formed on the eighth crystalline layer 117.

In an example, a lattice constant of the sixth crystalline layer 125 may be greater than a lattice constant of the eighth crystalline layer 117, and a lattice constant of the third crystalline layer 130 may be greater than the lattice constant of the sixth crystalline layer 125. The fifth crystalline layer 150 may be Si, and a lattice constant of the fifth crystalline layer 150 may be smaller than that of the eighth crystalline layer 117.

The seventh crystalline layer 116 and the sixth crystalline layer 125 may be formed of the same material and have the same lattice constant. A thickness of the sixth crystalline layer 125 may be equal to a total thickness of the eighth crystalline layer 117 and the seventh crystalline layer 116.

Figure 3:
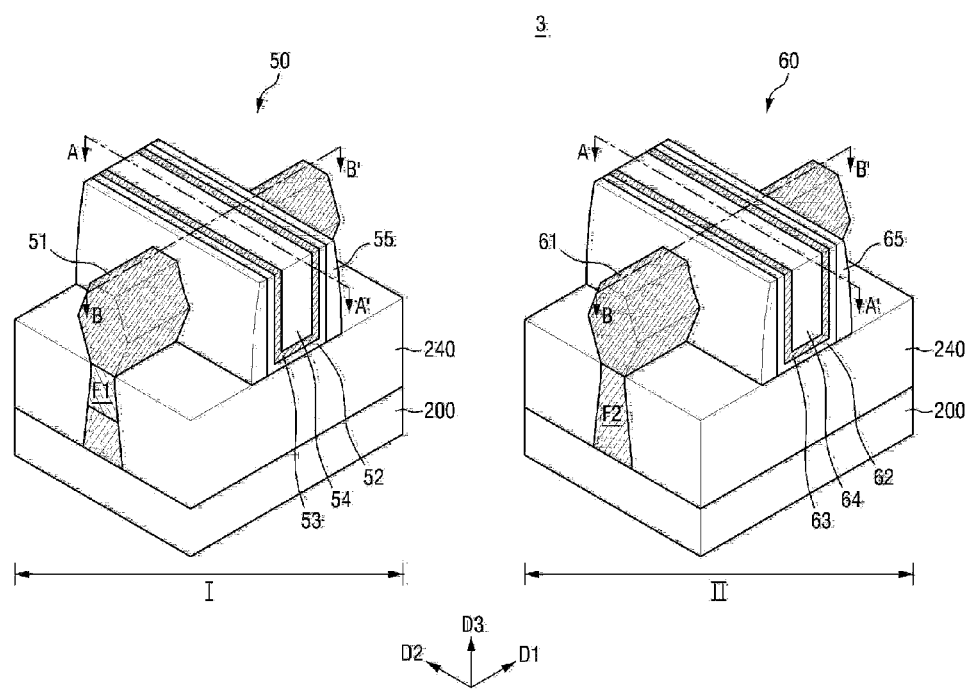
FIG. 3 is a perspective view of a semiconductor device according to a third embodiment.
Figure 4:
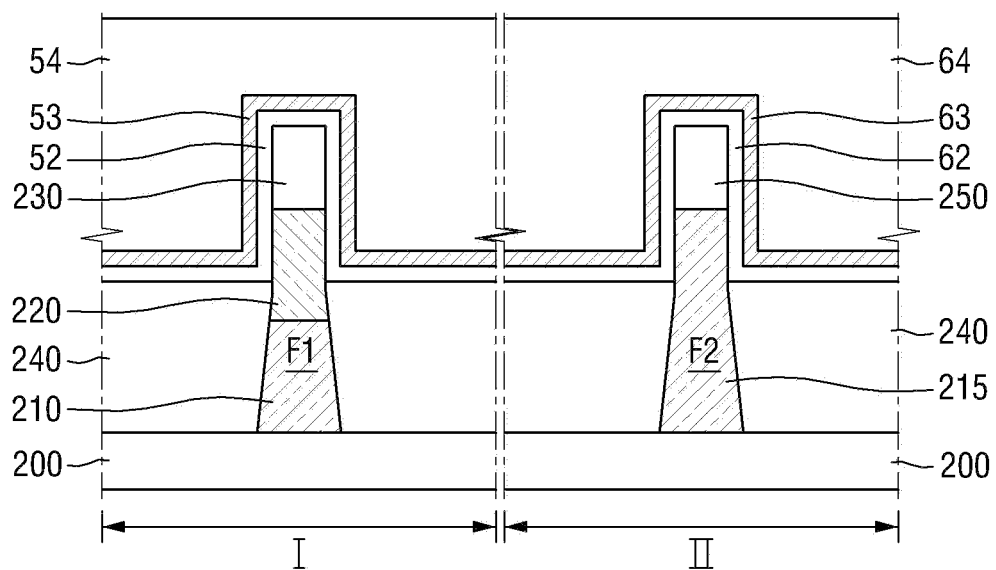
FIG. 4 is a cross-sectional view taken along the line A-A' of FIG. 3 according to one embodiment.

FIG. 3 is a perspective view of a semiconductor device 3 according to a third embodiment. FIG. 4 is a cross-sectional view taken along the line A-A' of FIG. 3 according to one embodiment, and FIG. 5 is a cross-sectional view taken along the line B-B' of FIG. 3 according to one embodiment.

Figure 5:
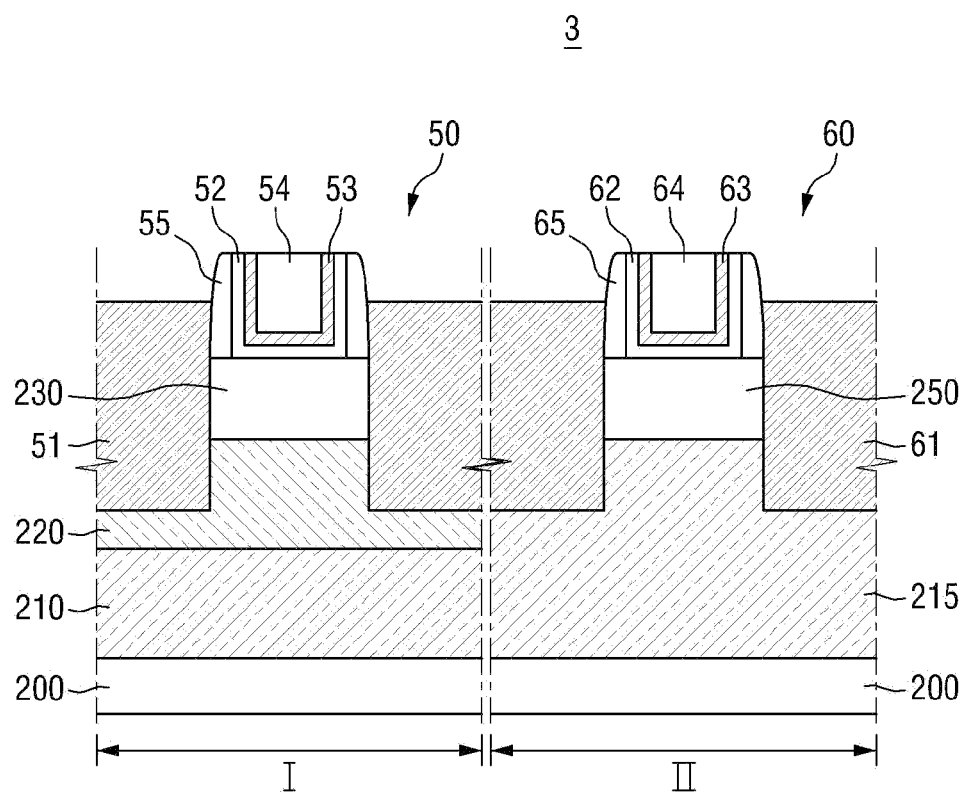
FIG. 5 is a cross-sectional view taken along the line B-B' of FIG. 3 according to one embodiment.

Referring to FIGS. 3 through 5, the semiconductor device 3 according to the third embodiment includes a substrate 200 and first and second fin-type transistors 50 and 60 formed on the substrate 200.

A device isolation layer 240 may be formed on the substrate 200 to define a first area I and a second area II of the substrate 200.

The first fin-type transistor 50 may be formed on the first area I of the substrate 200, and the second fin-type transistor 60 may be formed on the second area II of the substrate 200.

The first fin-type transistor 50 may include a first fin F1, a first gate electrode (53, 54), and first source/drain regions 51, and the second fin-type transistor 60 may include a second fin F2, a second gate electrode (63, 64), and second source/drain regions 61.

The first fin F1 and the second fin F2 may extend along a first direction D1. The device isolation layer 240 may cover side surfaces of the first fin F1 and the second fin F2.

The first gate electrode (53, 54) may include a first gate insulating layer 52, a first bottom gate metal 53 and a first top gate metal 54, and the second gate electrode (63, 64) may include a second gate insulating layer 62, a second bottom gate metal 63 and a second top gate metal 64.

The first and second gate insulating layers 52 and 62 may extend along a second direction D2. The first gate insulating layer 52 may be formed on the first fin F1 to intersect the first fin F1, and the second gate insulating layer 62 may be formed on the second fin F2 to intersect the second fin F2. Referring to FIG. 4, the first gate insulating layer 52 may be conformally formed along top and side surfaces of the first fin F1, and the second gate insulating layer 62 may be conformally formed along top and side surfaces of the second fin F2. The first and second gate insulating layers 52 and 62 may also be formed on the device isolation layer 240. The first and second gate insulating layers 52 and 62 may be formed of a silicon oxide layer. Alternatively, the first and second gate insulating layers 52 and 62 may be formed of a high-k material layer having a higher dielectric constant than that of the silicon oxide layer. In an example, the first and second gate insulating layers 52 and 62 may include at least one material selected from the group consisting of HfSiON, $HfO_2$, $ZrO_2$, $Ta_2O_5$, $TiO_2$, $SrTiO_5$ and $(Ba, Sr)TiO_3$.

The first and second bottom gate metals 53 and 63 may be formed on the first and second gate insulating layers 52 and 62, respectively. Referring to FIG. 5, the first bottom gate metal 53 may be conformally formed on the first gate insulating layer 52 to form a trench, and the second bottom gate metal 63 may be conformally formed on the second gate insulating layer 62 to form a trench. In an example, the first and second bottom gate metals 53 and 63 may include, but not limited to, TiN. The first and second top gate metals 54 and 64 may be formed on the first and second bottom gate metals 53 and 63 to fill the trenches formed by the first and second bottom gate metals 53 and 63, respectively. In an example, the first and second top gate metals 54 and 64 may include, but not limited to, W.

The first and second source/drain regions 51 and 61 may be formed on both sides of the first and second fins F1 and F2, respectively. The first and second source/drain regions 51 and 61 may be elevated source/drain regions. The first source/drain regions 51 may include a compressive stress material. In an example, the compressive stress material may be, but is not limited to, SiGe having a greater lattice constant than Si. The compressive stress material may adjust the mobility of carriers of the first fin-type transistor 50 by applying compressive stress to the first fin F1. The second source/drain regions 61 may include the same material as the substrate 200 or a tensile stress material. In an example, the tensile stress material may be, but is not limited to, SiC having a smaller lattice constant than Si. The tensile stress material may adjust the mobility of carriers of the second fin-type transistor 60 by applying tensile stress to the second fin F2.

First spacers 55 may insulate the first source/drain regions 51 from the first bottom gate metal 54, and second spacers 65 may insulate the second source/drain regions 61 from the second bottom gate metal 64. In an example, the first and second spacers 55 and 65 may include, but not limited to, a nitride layer or an oxynitride layer.

The first fin F1 may include a channel region of the first fin-type transistor 50, and the second fin F2 may include a channel region of the second fin-type transistor 60. The first fin F1 may include a first crystalline layer 210, a second crystalline layer 220, and a third crystalline layer 230 formed on the second crystalline layer 220. As described above, the first crystalline layer 210 and the second crystalline layer 220 may serve as an SRB, and the third crystalline layer 230 may be a channel layer.

The second fin F2 may include a fourth crystalline layer 215 and a fifth crystalline layer 250 formed on the fourth crystalline layer 215. As described above, the fourth crystalline layer 215 may serve as an SRB, and the fifth crystalline layer 250 may be a channel layer.

The first through third crystalline layers 210 through 230 have first through third lattice constants, respectively. The third lattice constant may be greater than the second lattice constant, and the second lattice constant may be greater than the first lattice constant.

The fourth crystalline layer 215 and the fifth crystalline layer 250 have a fourth lattice constant and a fifth lattice constant, respectively. The fifth lattice constant may be smaller than the fourth lattice constant.

The third crystalline layer 230 and the fifth crystalline layer 250 receive biaxial stress.

The first crystalline layer 210 may include a first material and a second material in a first composition ratio, and the second crystalline layer 220 may include the first material and the second material in a second composition ratio different from the first composition ratio. In addition, the third crystalline layer 230 may include the first material and the second material in a third composition rate different from the first and second composition ratios. That is, the first through third crystalline layers 210 through 230 may be formed of the same materials in different composition ratios.

The first crystalline layer 210 may include $Si_{1-x}Ge_x$ ($0<x<1$), and the second crystalline layer 220 may include $Si_{1-y}Ge_y$ ($0<y<1$, $y>x$). In addition, the third crystalline layer 230 may include $Si_{1-z}Ge_z$ ($0<z\le1$, $z>y$).

As described above, the fifth lattice constant is smaller than the fourth lattice constant, and the first lattice constant is equal to the fourth lattice constant. Therefore, the fourth crystalline layer 215 may include $Si_{1-x}Ge_x$ ($0<x<1$) which is the same material as the first crystalline layer 210. The fifth crystalline layer 250 may be, but is not limited to, an element semiconductor (e.g., Si).

In FIG. 3, for ease of description, the first fin F1 and the second fin F2 are illustrated as extending parallel to each other along the first direction D1. However, the present invention is not limited thereto. In an example, the first fin F1 may extend along the first direction D1, and the second fin F2 may extend along the second direction D2.

Likewise, in FIG. 3, the first gate electrode (53, 54) and the second gate electrode (63, 64) extend parallel to each other along the second direction D2. However, the present invention is not limited thereto. In an example, the first gate electrode (53, 54) may extend along the first direction D1, and the second gate electrode (63, 64) may extend along the second direction D2.

Figure 6:
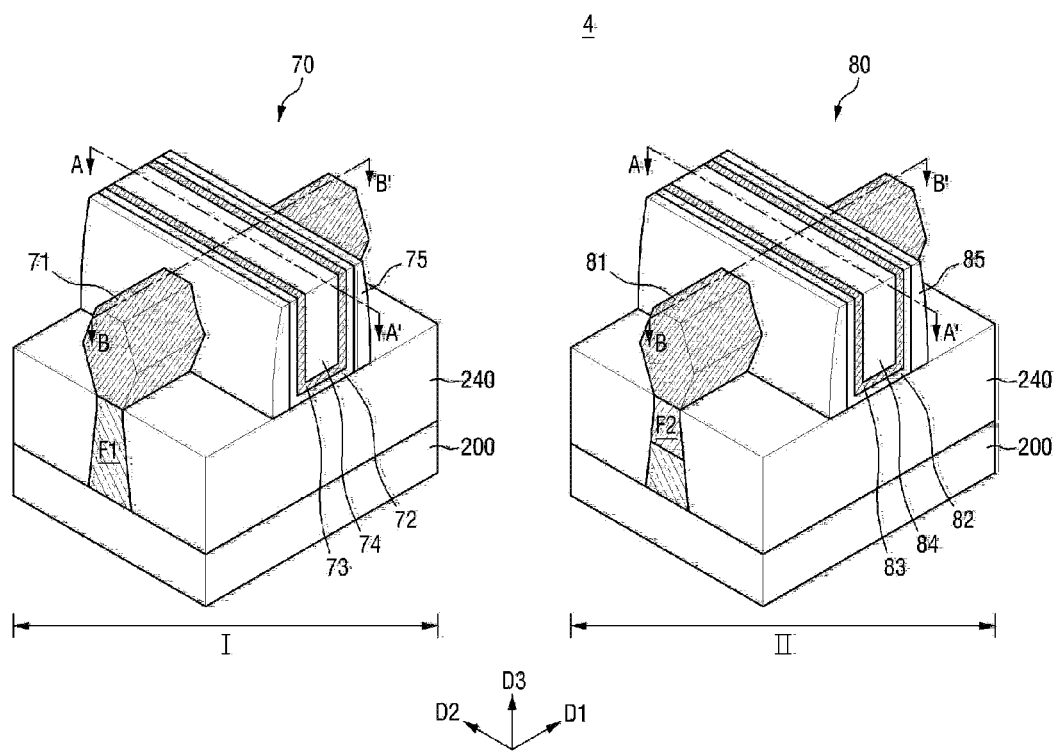
FIG. 6 is a perspective view of a semiconductor device according to a fourth embodiment.
Figure 7:
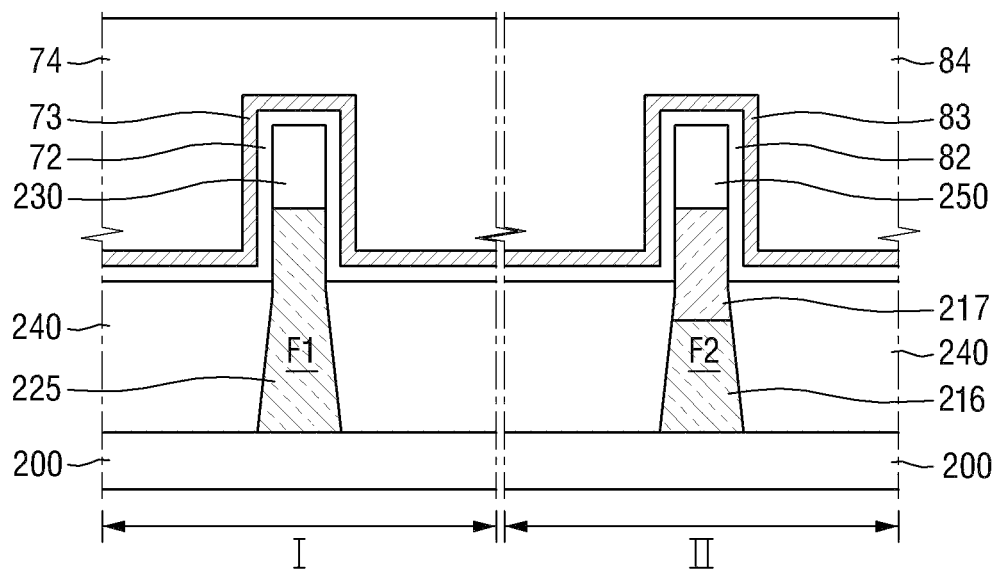
FIG. 7 is a cross-sectional view taken along the line A-A' of FIG. 6 according to one embodiment.
Figure 8:
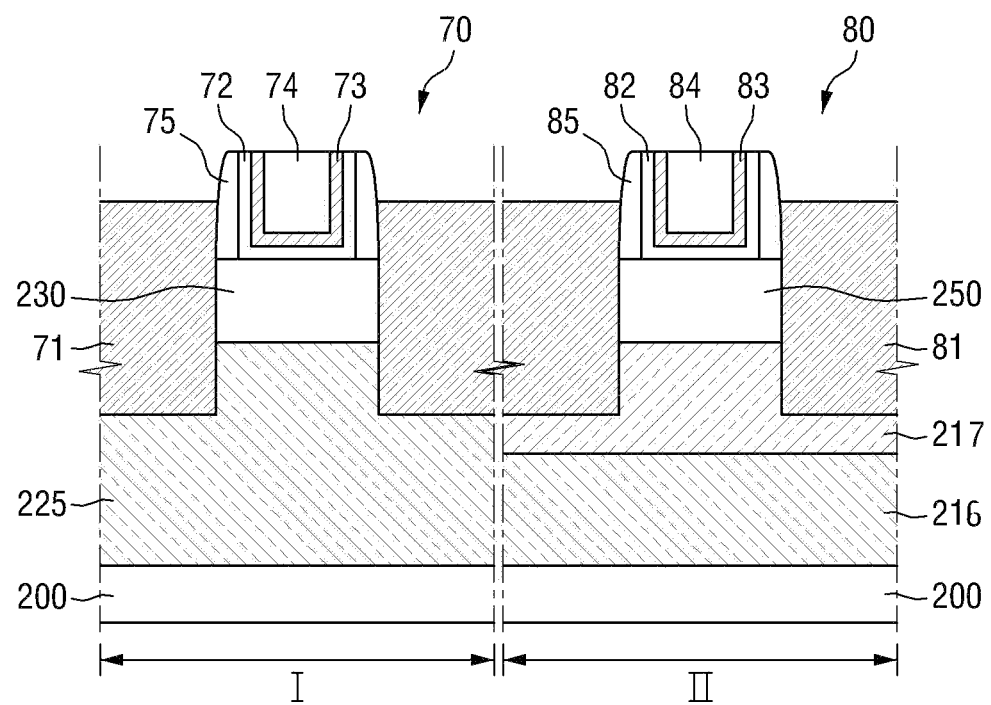
FIG. 8 is a cross-sectional view taken along the line B-B' of FIG. 6 according to one embodiment.

FIG. 6 is a perspective view of a semiconductor device 4 according to a fourth embodiment. FIG. 7 is a cross-sectional view taken along the line A-A' of FIG. 6 according to one embodiment, and FIG. 8 is a cross-sectional view taken along the line B-B' of FIG. 6 according to one embodiment. For simplicity, the following description will focus on differences from FIGS. 3 through 5.

Referring to FIGS. 6 through 8, the semiconductor device 4 according to the fourth embodiment includes a substrate 200 and first and second fin-type transistors 70 and 80 formed on the substrate 200.

A first area I may include a sixth crystalline layer 225 and a third crystalline layer 230 formed on the sixth crystalline layer 225. A second area II may include a seventh crystalline layer 216, an eighth crystalline layer 217, and a fifth crystalline layer 250 formed on the eighth crystalline layer 217.

In an example, a lattice constant of the sixth crystalline layer 225 may be greater than a lattice constant of the eighth crystalline layer 217, and a lattice constant of the third crystalline layer 230 may be greater than the lattice constant of the sixth crystalline layer 225. The fifth crystalline layer 250 may be Si, and a lattice constant of the fifth crystalline layer 250 may be smaller than that of the eighth crystalline layer 217.

Figure 9:
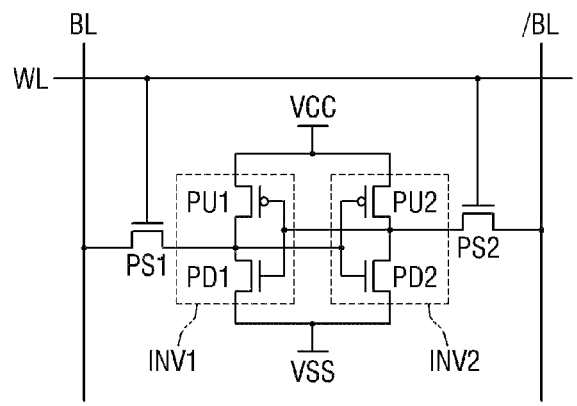
FIG. 9 is a circuit diagram of a semiconductor device according to a fifth embodiment.
Figure 10:
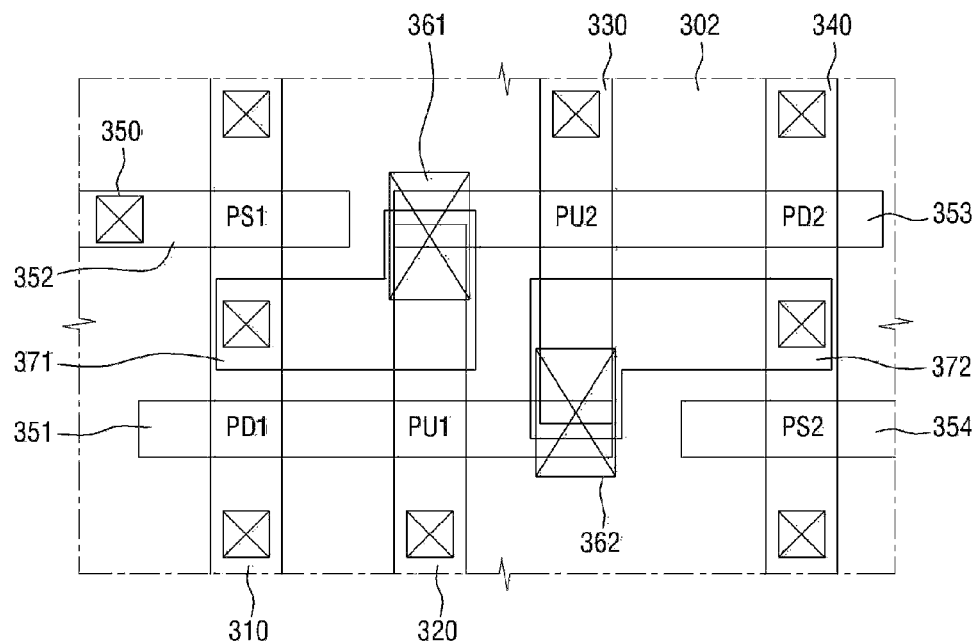
FIG. 10 is a layout diagram of the circuit diagram of FIG. 9 according to the fifth embodiment.

FIG. 9 is a circuit diagram of a semiconductor device 5 according to a fifth embodiment. FIG. 10 is a layout diagram of the circuit diagram of FIG. 9 according to the fifth embodiment.

Referring to FIG. 9, the semiconductor device 5 according to the fifth embodiment includes a pair of first and second inverters INV1 and INV2 connected in parallel between a power supply node VCC and a ground node VSS and first and second pass transistors PS1 and PS2 respectively connected to output nodes of the first and second inverters INV1 and INV2.

The first inverter INV1 may include a first pull-up transistor PU1 and a first pull-down transistor PD1 connected in series, and the second inverter INV2 may include a second pull-up transistor PU2 and a second pull-down transistor PD2 connected in series. The first and second pull-up transistors PU1 and PU2 may be P-type transistors, and the first and second pull-down transistors PD1 and PD2 may be N-type transistors.

An input node of the first inverter INV1 may be connected to the output node of the second inverter INV2, and an input node of the second inverter INV2 may be connected to the output node of the first inverter INV1 so as for the first and second inverters INV1 and INV2 to form a single latch circuit.

The first and second pass transistors PS1 and PS2 may be connected to a bit line BL and a complementary bit line BL/, respectively. Gates of the first and second pass transistors PS1 and PS2 may be connected to a word line WL.

Referring to FIG. 10, a first active region 310, a second active region 320, a third active region 330 and a fourth active region 340 may be formed to extend in one direction (for example, the vertical direction in FIG. 10). The second active region 320 and the third active region 330 may be shorter than the first active region 310 and the fourth active region 340.

A first gate electrode 351, a second gate electrode 352, a third gate electrode 353 and a fourth gate electrode 354 may be formed to extend in another direction (for example, the horizontal direction in FIG. 10) and to intersect the first, second, third and fourth active regions 310, 320, 330 and 340. More specifically, the first gate electrode 351 may completely intersect the first active region 310 and the second active region 320, and may partially overlap an end of the third active region 330. The third gate electrode 353 may completely intersect the fourth active region 340 and the third active region 330, and may partially overlap an end of the second active region 320. The second gate electrode 352 and the fourth gate electrode 354 may intersect the first active region 310 and the fourth active region 340, respectively.

As shown in FIG. 10, the first pull-up transistor PU1 is defined near the intersection between the first gate electrode 351 and the second active region 320. The first pull-down transistor PD1 is defined near the intersection between the first gate electrode 351 and the first active region 310. The first pass transistor PS1 is defined near the intersection between the second gate electrode 352 and the first active region 310. The second pull-up transistor PU2 is defined near the intersection between the third gate electrode 353 and the third active region 330. The second pull-down transistor PD2 is defined near the intersection between the third gate electrode 353 and the fourth active region 340. The second pass transistor PS2 is defined near the intersection between the fourth gate electrode 354 and the fourth active region 340.

Even though not specifically illustrated, source/drain regions may be formed on both sides of each of the intersections between the first, second, third and fourth gate electrodes 351, 352, 353 and 354 and the first, second, third and fourth active regions 310, 320, 330 and 340, respectively.

A plurality of contacts 350 may also be formed.

A first shared contact 361 may connect the second active region 320, the third gate line 353 and first wiring 371 at the same time. A second shared contact 362 may connect the third active region 330, the first gate line 351 and second wiring 372 at the same time.

In an example, the first pull-up transistor PU1 and the second pull-up transistor PU2 may be configured in the same way as the first transistors 10 and 30 of FIGS. 1 and 2 or the first fin-type transistors 50 and 70 of FIGS. 3 through 8. In an example, the first pull-down transistor PD1 and the second pull-down transistor PD may be configured in the same way as the second transistors 20 and 40 of FIGS. 1 and 2 or the second fin-type transistors 60 and 80 of FIGS. 3 through 8.

Figure 11:
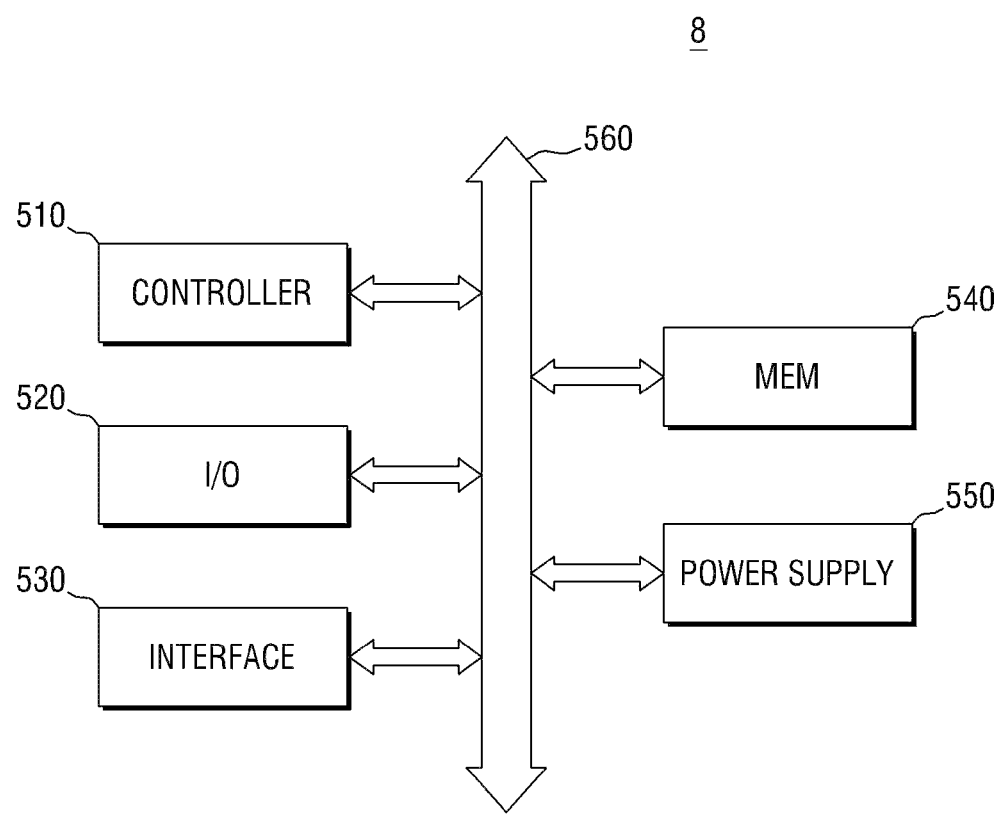
FIG. 11 is a block diagram of an electronic system including semiconductor devices according to certain embodiments.

FIG. 11 is a block diagram of an electronic system 8 including semiconductor devices according to certain embodiments.

Referring to FIG. 11, the electronic system 8 may include a controller 510, an input/output (I/O) device 520, an interface 530, a memory device 540, a power supply 550, and a bus 560. The controller 510, the I/O device 520, the interface 530, the memory device 540 and the power supply 550 may be connected to one another by the bus 560. The bus 560 may serve as a path for transmitting data.

The controller 510 may include at least one of a microprocessor, a digital signal processor, a microcontroller and logic devices capable of performing similar functions to those of a microprocessor, a digital signal processor and a microcontroller. The I/O device 520 may include, for example, a keypad, a keyboard and a display device. The interface 530 may be used to transmit data to or receive data from a communication network. The interface 530 may be a wired or wireless interface. The memory device 540 may store data and/or commands. The power supply 550 may supply operating power to the controller 510, the I/O device 520, the interface 530, and the memory device 540. Although not specifically illustrated, the electronic system 8 may further include a high-speed dynamic random access memory (DRAM) or static random access memory (SRAM) as an operating memory for improving the operation of the controller 510.

The semiconductor devices 1 through 4 according to the disclosed embodiments may be provided in the controller 510, the I/O device 520 or the memory device 540.

The electronic system 8 may be applied to nearly all types of electronic products capable of transmitting and/or receiving information in a wireless environment, such as a personal digital assistant (PDA), a portable computer, a web tablet, a wireless phone, a mobile phone, a digital music player, a memory card, etc.

A method of fabricating the semiconductor device described above with reference to FIG. 1 will now be described. FIGS. 12 through 19 are exemplary views illustrating operations of a method of fabricating the semiconductor device according to the first embodiment.

Figure 12:
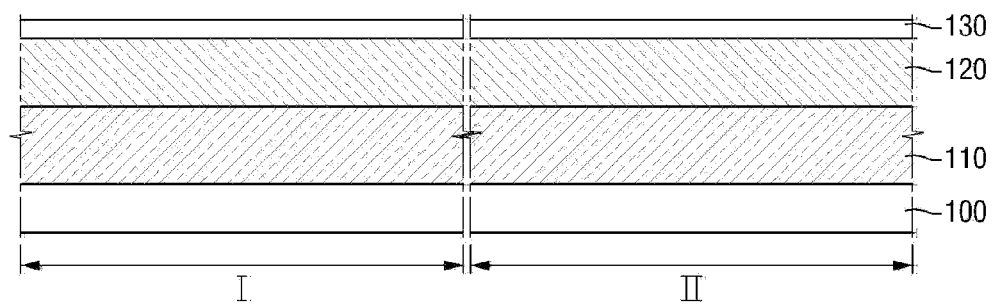
FIGS. 12 through 19 are exemplary views illustrating operations of a method of fabricating the semiconductor device according to the first embodiment.

Referring to FIG. 12, a first crystalline layer 110 is formed on a substrate 100, a second crystalline layer 120 is formed on the first crystalline layer 110, and a third crystalline layer 130 is formed on the second crystalline layer 120. In an example, a lattice constant of the second crystalline layer 120 may be greater than a lattice constant of the first crystalline layer 110, and a lattice constant of the third crystalline layer 130 may be greater than the lattice constant of the second crystalline layer 120. The third crystalline layer 130 may be formed to an appropriate thickness within a range that does not cause crystal defects.

Figure 13:
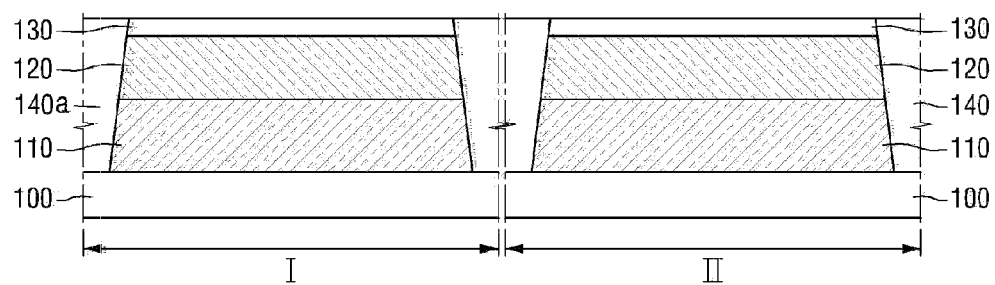

Referring to FIG. 13, the first crystalline layer 110, the second crystalline layer 120 and the third crystalline layer 130 are patterned to form a trench that divides the substrate 100 into a first area I and a second area II. Then, the trench is filled with an insulating material. Here, the trench may be formed to expose a top surface of the substrate 100 or to expose a top surface of the first crystalline layer 110.

Figure 14:
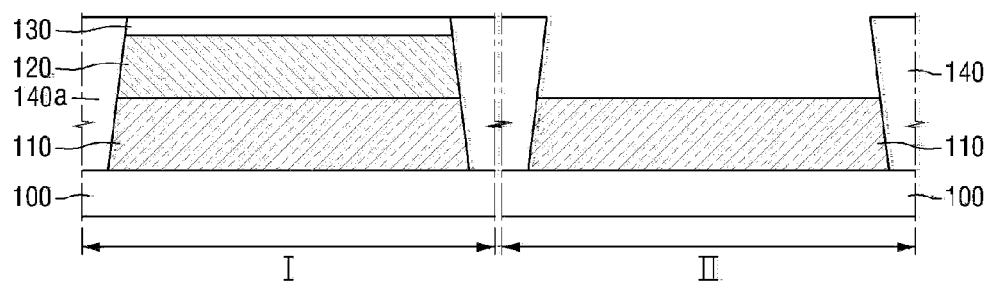

Referring to FIG. 14, the second crystalline layer 120 and the third crystalline layer 130 disposed on the second area II of the substrate 100 are etched to expose the first crystalline layer 110.

Figure 15:
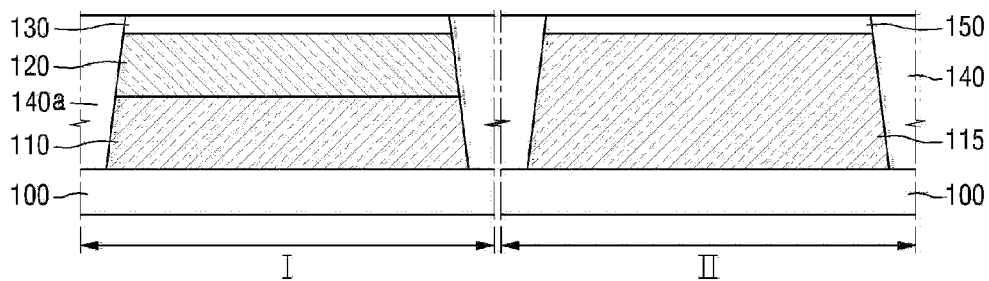

Referring to FIG. 15, the first crystalline layer 110 on the second area II of the substrate 100 is grown again to a height equal to that of the second crystalline layer 120, thereby completing a fourth crystalline layer 115. Then, a fifth crystalline layer 150 is formed on the fourth crystalline layer 115. In one embodiment, the first crystalline layer 110 disposed on the second area II of the substrate 100 may be re-grown by a selective epitaxial growth (SEG) process. Since the fourth crystalline layer 115 is completed by re-growing the same materials as the first crystalline layer 110 in the same composition ratio as that of the first crystalline layer 110, defects due to a difference in lattice constant can be reduced.

Figure 16:
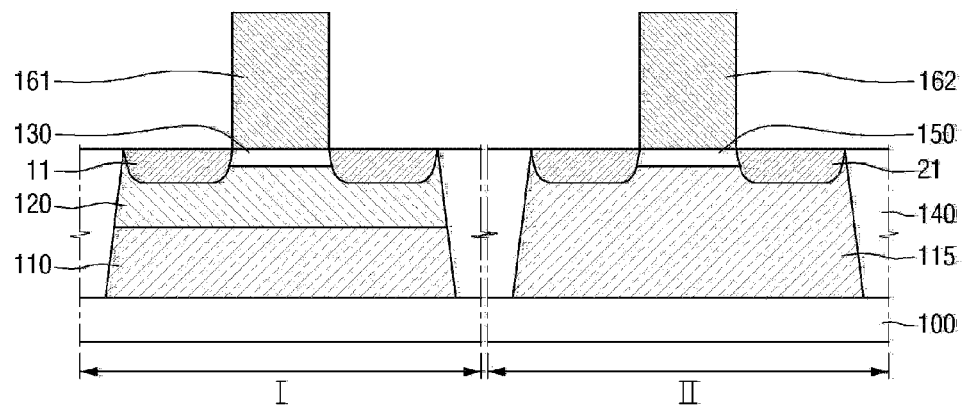

Referring to FIG. 16, a first dummy gate 161 is formed on the third crystalline layer 130, a second dummy gate 162 is formed on the fifth crystalline layer 150, and first and second source/drain regions 11 and 21 are formed on both sides of the respective first and second dummy gates 161 and 162. In an example, the first source/drain regions 11 may be formed by recessing the second crystalline layer 120 and the third crystalline layer 130, and the second source/drain regions 21 may be formed by recessing the fourth crystalline layer 115 and the fifth crystalline layer 150. However, the present invention is not limited thereto. Alternatively, the first and second source/drain regions 11 and 21 may be formed by recessing first and second channel layers (i.e., the third and fifth crystalline layers 130 and 150), respectively.

Figure 17:
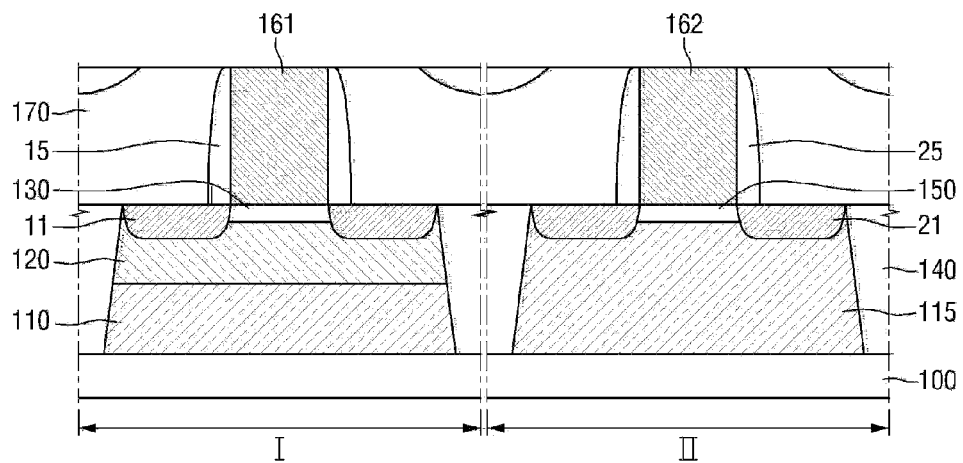

Referring to FIG. 17, first and second spacers 15 and 25 are formed on both sides of the respective first and second dummy gates 161 and 162, and an interlayer insulating film 170 is formed to cover both sides of the respective first and second spacers 15 and 25.

Figure 18:
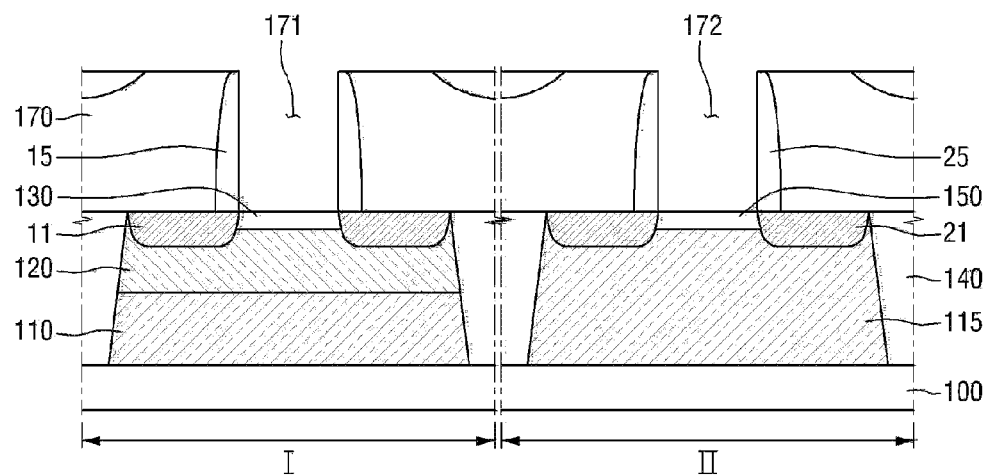

Referring to FIG. 18, first and second trenches 171 and 172 are formed by removing the first and second dummy gates 161 and 162. The first and second trenches 171 and 172 may expose top surfaces of the first and second channel layers 130 and 150 (i.e., the third and fifth crystalline layers 130 and 150), respectively.

Figure 19:
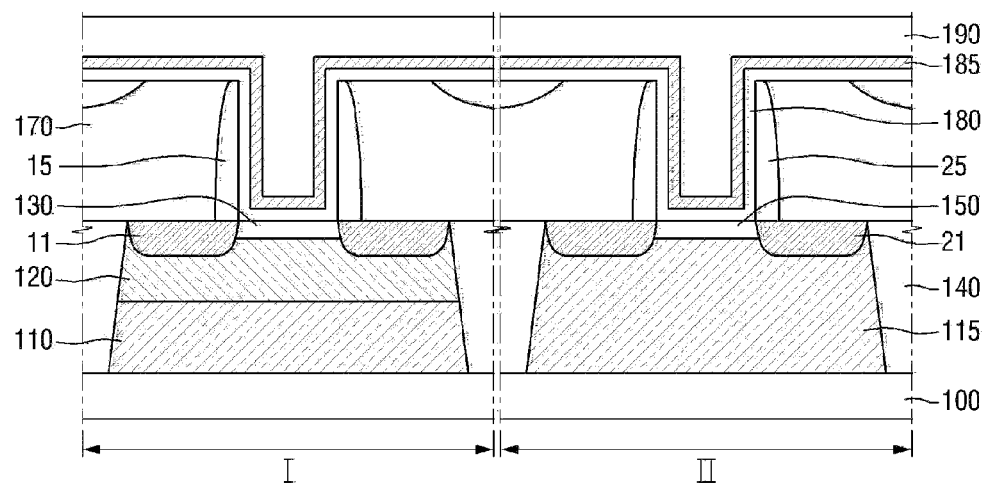

Referring to FIG. 19, a gate insulating layer 180 is conformally formed on the interlayer insulating film 170 along sidewalls and a bottom surface of each of the first and second trenches 171 and 172. Then, a bottom gate metal 185 is conformally formed on the gate insulating layer 180. After the formation of the bottom gate metal 185, a top gate metal 190 is formed on the bottom gate metal 185. The top gate metal 190 may be formed to fill the first and second trenches 171 and 172.

Referring back to FIG. 1, the top gate metal 190 is polished until a top surface of the interlayer insulating film 170 is exposed, thereby completing a first gate electrode (13, 14) and a second gate electrode (23, 24).

In concluding the detailed description, those skilled in the art will appreciate that many variations and modifications can be made to the disclosed embodiments without substantially departing from the principles of the present invention. Therefore, the disclosed embodiments are used in a generic and descriptive sense only and not for purposes of limitation. Accordingly, all such modifications are intended to be included within the scope of this inventive concept as defined in the claims.

What is claimed is:

1. A semiconductor device comprising:
   a substrate including a first area and a second area;
   first through third crystalline layers sequentially stacked on the first area and having first through third lattice constants, respectively;
   a first gate electrode formed on the third crystalline layer;
   fourth and fifth crystalline layers sequentially stacked on the second area and having fourth and fifth lattice constants, respectively; and
   a second gate electrode formed on the fifth crystalline layer,
   wherein the third lattice constant is greater than the second lattice constant, the second lattice constant is greater than the first lattice constant, and the fifth lattice constant is smaller than the fourth lattice constant.

2. The semiconductor device of claim 1, wherein the first lattice constant and the fourth lattice constant are equal to each other.

3. The semiconductor device of claim 2, wherein the first crystalline layer comprises a first material and a second material in a first composition ratio, the second crystalline layer comprises the first material and the second material in a second composition ratio different from the first composition ratio.

4. The semiconductor device of claim 3, wherein the third crystalline layer comprises the first material and the second material in a third composition ratio different from the first and second composition ratios.

5. The semiconductor device of claim 3, wherein the first crystalline layer comprises $Si_{1-x}Ge_x$, where $0<x<1$, and the second crystalline layer comprises $Si_{1-y}Ge_y$, where $0<y<1$ and $y>x$.

6. The semiconductor device of claim 5, wherein the third crystalline layer comprises $Si_{1-z}Ge_z$, where $0<z\leq 1$ and $z>y$.

7. The semiconductor device of claim 6, wherein the fourth crystalline layer comprises $Si_{1-x}Ge_x$, where $0<x<1$, and the fifth crystalline layer comprises Si.

8. The semiconductor device of claim 1, wherein the first through fourth crystalline layers are compound semiconductor layers, and the fifth crystalline layer is an element semiconductor layer.

9. The semiconductor device of claim 1, wherein a total thickness of the first through third crystalline layers is equal to a total thickness of the fourth and fifth crystalline layers.

10. The semiconductor device of claim 1, further comprising a first device isolation layer which is formed around the first through third crystalline layers, wherein a height of a top surface of the third crystalline layer and a height of a top surface of the first device isolation layer are equal to each other.

11. The semiconductor device of claim 10, wherein a bottom surface of the first crystalline layer and a bottom surface of the first device isolation layer are connected to each other.

12. The semiconductor device of claim 1, wherein the first crystalline layer and the fourth crystalline layer directly contact the substrate.

13. The semiconductor device of claim 1, wherein the first through fifth crystalline layers are epitaxial layers.

14. A semiconductor device comprising:
   a substrate in which a P-type transistor area and an N-type transistor area are defined;
   a first compound semiconductor layer formed on the P-type transistor area and having a first composition ratio;
   a second compound semiconductor layer on the first compound semiconductor and layer having a second composition ratio different from the first composition ratio;
   a first gate electrode formed on the second compound semiconductor layer;
   a third compound semiconductor layer formed on the N-type transistor area and having the first composition ratio; and
   a second gate electrode formed on the third compound semiconductor layer,
   wherein the third compound semiconductor layer is thicker than the first compound semiconductor layer.

15. The semiconductor device of claim 14, further comprising:
   a first channel layer formed between the second compound semiconductor layer and the first gate electrode; and
   a second channel layer formed between the third compound semiconductor layer and the second gate electrode,
   wherein the first channel layer is a compressive strained channel, and the second channel layer is a tensile strained channel.

16. A semiconductor device comprising:
   a substrate including a first area and a second area;
   first and second crystalline layers sequentially stacked on the first area and having first and second lattice constants, respectively;
   a first gate electrode formed on the second crystalline layer;
   third and fourth crystalline layers sequentially stacked on the second area and having third and fourth lattice constants, respectively; and
   a second gate electrode formed on the fourth crystalline layer,
   wherein the second lattice constant is greater than the first lattice constant, the first lattice constant is greater than the third lattice constant, and the fourth lattice constant is smaller than the third lattice constant.

17. The semiconductor device of claim 16, further comprising:

fifth crystalline layer formed between the first crystalline layer and the substrate on the first area and having a fifth lattice constant, wherein the fifth lattice constant is equal to the third lattice constant.

18. The semiconductor device of claim 16, further comprising:

fifth crystalline layer formed between the third crystalline layer and the substrate on the second area and having a fifth lattice constant, wherein the fifth lattice constant is equal to the first lattice constant.

19. The semiconductor device of claim 16, wherein the first and second areas include a P-type transistor and an N-type transistor, respectively.

20. The semiconductor device of claim 16, wherein each of the first, second and third crystalline layers includes a compound semiconductor material and the fourth crystalline layer includes an element semiconductor material.

* * * * *